(12) United States Patent
Ding et al.

(10) Patent No.: US 12,527,095 B2
(45) Date of Patent: Jan. 13, 2026

(54) METHOD OF FABRICATING Si PHOTONICS CHIP WITH INTEGRATED HIGH SPEED GE PHOTO DETECTOR WORKING FOR ENTIRE C- AND L-BAND

(71) Applicant: MARVELL ASIA PTE LTD, Singapore (SG)

(72) Inventors: Liang Ding, Arcadia (CA); Masaki Kato, Palo Alto, CA (US); Radhakrishnan Nagarajan, Santa Clara, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 383 days.

(21) Appl. No.: 18/126,119

(22) Filed: Mar. 24, 2023

(65) Prior Publication Data

US 2023/0307572 A1 Sep. 28, 2023

Related U.S. Application Data

(60) Provisional application No. 63/323,161, filed on Mar. 24, 2022.

(51) Int. Cl.
*H10F 30/222* (2025.01)
*H10F 30/223* (2025.01)
*H10F 71/00* (2025.01)
*H10F 77/122* (2025.01)
*H10F 77/14* (2025.01)
*H10F 77/30* (2025.01)

(52) U.S. Cl.
CPC ......... *H10F 30/222* (2025.01); *H10F 30/223* (2025.01); *H10F 71/121* (2025.01); *H10F 77/122* (2025.01); *H10F 77/14* (2025.01); *H10F 77/306* (2025.01)

(58) Field of Classification Search
CPC ...... H10F 30/222; H10F 30/223; H10F 77/14; H10F 77/306
See application file for complete search history.

(56) References Cited

U.S. PATENT DOCUMENTS

2013/0202005 A1* 8/2013 Dutt .................. H10F 71/121
372/50.1

* cited by examiner

*Primary Examiner* — Matthew L Reames

(57) ABSTRACT

A receiver for receiving optical signals transmitted over a communications network includes a silicon photonics substrate including multiple regions with respectively different doping, an epitaxial germanium layer extending at least partially over at least two or more of regions with different doping, and at least one of a tensile stressor component and a compressive stressor component in contact with the epitaxial germanium layer. The tensile stressor component and the compressive stressor component are respectively configured to mechanically strain the epitaxial germanium layer to modify an optical signal absorption attribute of the epitaxial germanium layer. The receiver includes a receive circuit including at least one electrode component in electrical contact with the epitaxial germanium layer. The receive circuit is configured to generate an electrical output in response to an optical signal received from a network interface of the communications network by the epitaxial germanium layer.

16 Claims, 15 Drawing Sheets

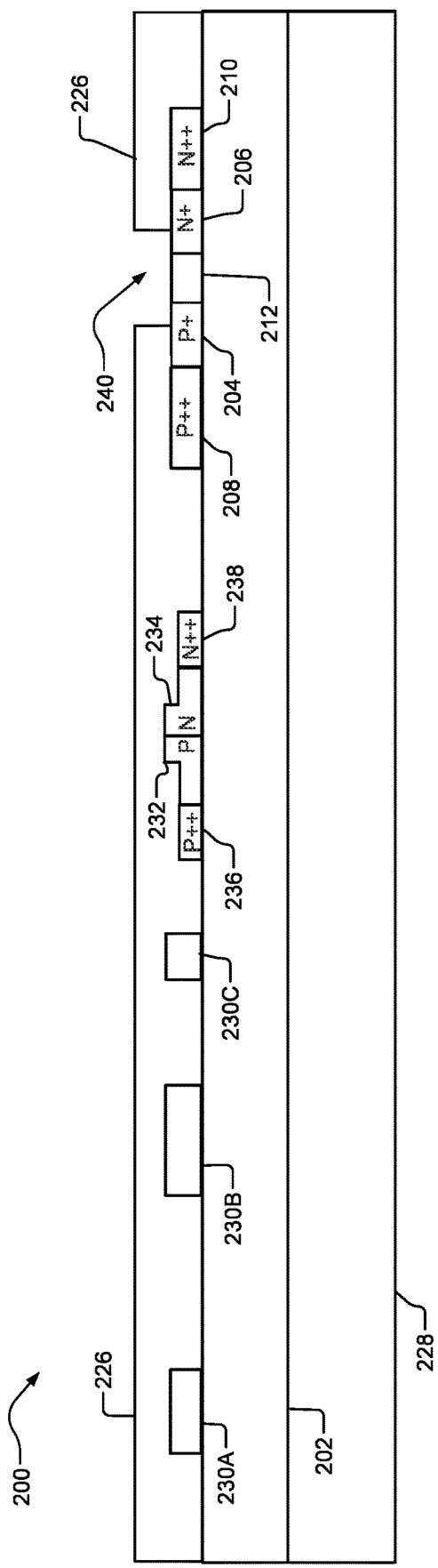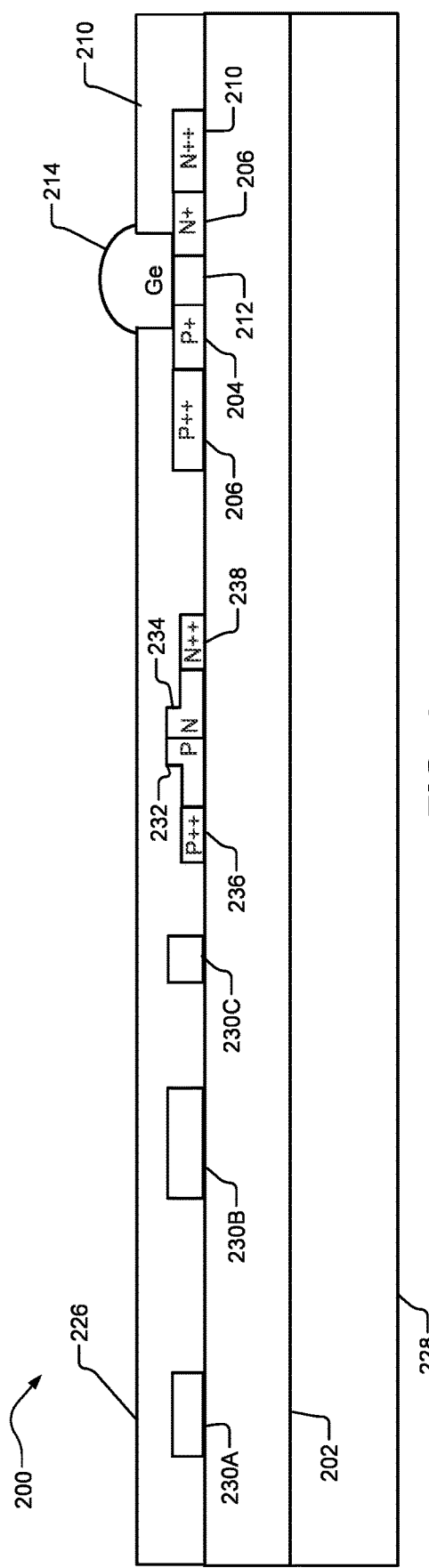

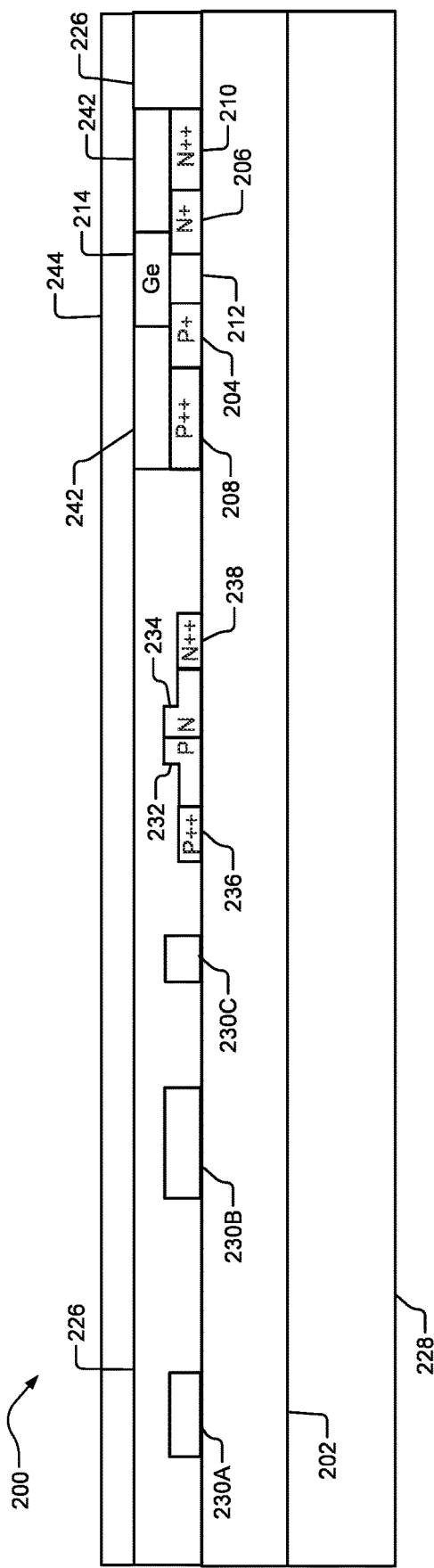
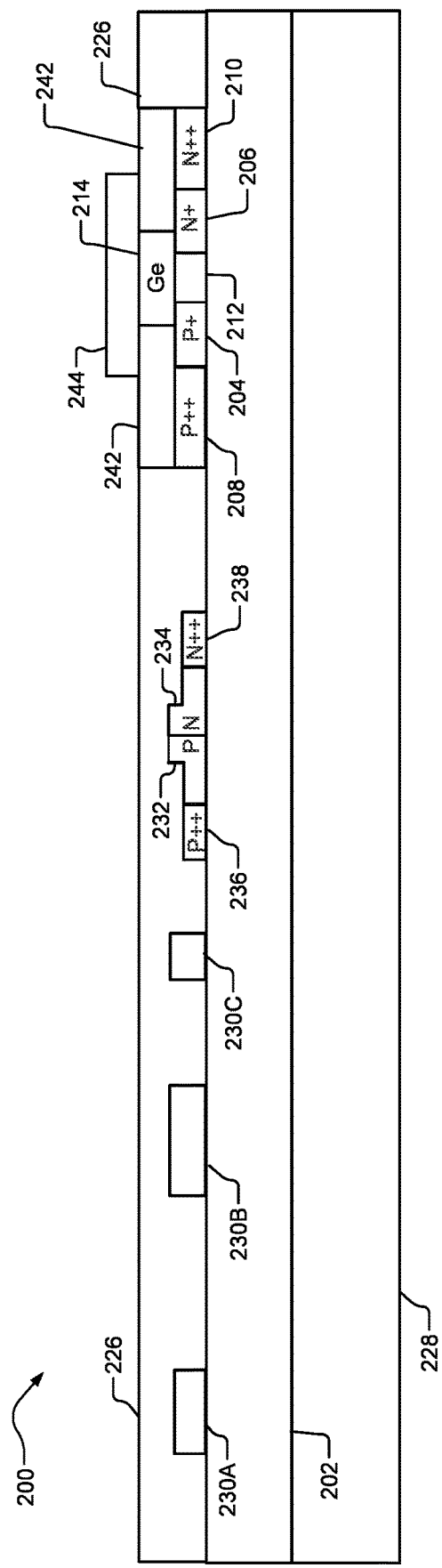

METHOD OF FABRICATING Si PHOTONICS CHIP WITH INTEGRATED HIGH SPEED GE PHOTO DETECTOR WORKING FOR ENTIRE C- AND L-BAND

CROSS-REFERENCE TO RELATED APPLICATION

This application claims the benefit of U.S. Provisional Application No. 63/323,161, filed on Mar. 24, 2022. The entire disclosure of the application referenced above is incorporated herein by reference.

FIELD

The present disclosure relates to receivers for receiving optical signals transmitted over a communications network, and more specifically to receivers including a germanium-based photo detector for detecting optical signals in a C-band and an L-band.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Broadband communication systems can include silicon photonics systems that are to satisfy different bandwidth, signal-to-noise ratio, and power requirements for short-reach, metro, or long-haul data transmission. Silicon phonics devices can include active components and passive components. The active components can include modulators and photodetectors. The passive components can include power splitters, polarization splitter-rotators, and input and output couplers. The active and passive devices can be connected to each other using waveguides.

SUMMARY

A receiver for receiving optical signals transmitted over a communications network is disclosed and includes a silicon photonics substrate including multiple regions with respectively different doping, an epitaxial germanium layer extending at least partially over at least two or more of regions with different doping, and at least one of a tensile stressor component and a compressive stressor component in contact with the epitaxial germanium layer, the tensile stressor component and the compressive stressor component respectively configured to mechanically strain the epitaxial germanium layer to modify an optical signal absorption attribute of the epitaxial germanium layer. The receiver includes a receive circuit including at least one electrode component in electrical contact with the epitaxial germanium layer, the receive circuit configured to generate an electrical output in response to an optical signal received from a network interface of the communications network by the epitaxial germanium layer.

In other features, the tensile stressor component comprises a tensile stressor film in contact with a lateral side of the epitaxial germanium layer. In other features, the tensile stressor film is a first tensile stressor film, the lateral side of the epitaxial germanium layer is a first lateral side, and the receiver includes a second tensile stressor film in contact with a second lateral side of the epitaxial germanium layer, the second lateral side on an opposite side of the epitaxial germanium layer as the first lateral side.

In other features, each of the first tensile stressor film and the second tensile stressor film include a silicon nitride tensile stress film. In other features, the silicon nitride tensile stress film is configured to mechanically strain the epitaxial germanium layer with a tensile stress of at least 400 MPa.

In other features, the compressive stressor component comprises a compressive stressor film in contact with a top surface of the epitaxial germanium layer. In other features, wherein the compressive stressor film includes a silicon dioxide compressive stress film.

In other features, the at least one of the tensile stressor component and the compressive stressor component is configured to mechanically strain the epitaxial germanium layer with tensile stress to modify a band gap of the epitaxial germanium layer to detect optical signals having a wavelength in a range of at least 1530 nanometers to 1565 nanometers.

In other features, the at least one of the tensile stressor component and the compressive stressor component is configured to mechanically strain the epitaxial germanium layer with tensile stress to modify the band gap of the epitaxial germanium layer to detect optical signals having a wavelength in a range of at least 1530 nanometers to 1625 nanometers.

In other features, the receiver includes a cladding layer at least partially overlaying the silicon photonics substrate and the epitaxial germanium layer, wherein the cladding layer includes an insulator material. In other features, the cladding layer is coextensive with the silicon photonics substrate.

In other features, the receiver includes at least one silicon nitride layer embedded in the cladding layer, the at least one silicon nitride layer defining at least a portion of a waveguide configured to transmit optical signals received from the network interface of the communications network to the epitaxial germanium layer.

In other features, the at least one electrode component is a first electrode component in electrical contact with a first lateral side of the epitaxial germanium layer, and the receiver includes a second electrode component in electrical contact with a second lateral side of the epitaxial germanium layer, the second lateral side on an opposite side of the epitaxial germanium layer as the first lateral side.

In other features, the first electrode component and the second electrode component are in electrical contact with only the first lateral side and the second lateral side of the epitaxial germanium layer to conduct current laterally through the epitaxial germanium layer to inhibit a dark current during periods where the epitaxial germanium layer does not detect an optical communication signal.

In other features, the epitaxial germanium layer is configured to operate as a high-speed photo diode for detection of optical communication signals that are transmitted over a network interconnection.

In other features, the at least one of the tensile stressor component and the compressive stressor component is configured to mechanically strain the epitaxial germanium layer to modify a bandgap property of the of the epitaxial germanium layer to modify an optical signal absorption range of the epitaxial germanium layer.

A method of fabricating a receiver for receiving optical signals transmitted over a communications network is disclosed, and includes doping a silicon photonics substrate to create multiple regions with respectively different doping, depositing an epitaxial germanium layer extending at least partially over at least two or more of the regions with different doping, and fabricating a tensile stressor component in contact with a lateral side of the epitaxial germanium layer. The tensile stressor component is configured to mechanically strain the epitaxial germanium layer to modify an optical signal absorption attribute of the epitaxial germanium layer. The method includes fabricating at least one electrode component in electrical contact with the epitaxial germanium layer.

In other features, the tensile stressor component is a first tensile stressor component, the lateral side is a first lateral side, and the method further comprises fabricating a second tensile stressor component in contact with a second lateral side of the epitaxial germanium layer, the first lateral side on an opposite side of the epitaxial germanium layer as the second lateral side. In other features, the method includes fabricating a compressive stressor component in contact with a top surface of the epitaxial germanium layer.

In other features, fabricating the tensile stressor component and fabricating the compressive stressor component include specifying deposition parameters of the tensile stressor component and the compressive stressor component to mechanically strain the epitaxial germanium layer with tensile stress to modify a band gap of the epitaxial germanium layer to detect optical signals having a wavelength in a range of at least 1530 nanometers to 1565 nanometers.

In other features, fabricating the tensile stressor component and fabricating the compressive stressor component include specifying deposition parameters of the tensile stressor component and the compressive stressor component to mechanically strain the epitaxial germanium layer with tensile stress to modify the band gap of the epitaxial germanium layer to detect optical signals having a wavelength in a range of at least 1530 nanometers to 1625 nanometers.

In other features, depositing the epitaxial germanium layer includes depositing the epitaxial germanium layer via an epitaxy process at a thickness of greater than or equal to 300 nanometers, and performing a chemical mechanical planarization process to remove a top portion of the epitaxial germanium layer.

In other features, fabricating the tensile stressor component includes performing a plasma-enhanced chemical vapor deposition (PECVD) process to deposit a silicon nitride film having a tensile stress of at least 400 MPa, and the tensile stress of the silicon nitride film is specified according to parameters of PECVD process. In other features, depositing the compressive stressor component includes performing a high density plasma chemical vapor deposition process to deposit a silicon dioxide film.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 3 is a side sectional view of a receiver during an example fabrication process, illustrating clearing of a window in the cladding oxide layer of FIG. 2.

FIG. 4 is a side sectional view of a receiver during an example fabrication process, illustrating epitaxial deposition of germanium in the window of FIG. 3.

FIG. 10 is a side sectional view of a receiver during an example fabrication process, illustrating deposition of a compressive stressor film over the top surface of the epitaxial germanium layer of FIG. 9.

FIG. 11 is a side sectional view of a receiver during an example fabrication process, illustrating etching the excessive compressive stressor film of FIG. 10.

In the drawings, reference numbers may be reused to identify similar and/or identical elements.

DESCRIPTION

Silicon photonics circuits used for broadband telecommunication, data center connectivity and bio-sensing applications include active components and passive components. Waveguide assemblies are used to optically route signals to various active and passive components. One type of waveguide assembly having a monolithic multi-layer silicon photonics stack structure includes a silicon (Si) strip waveguide and a silicon nitride (SiN) strip waveguide, along with metal layers, germanium and oxide layers, and ion plantations for electrical and optical signal transmission on the chip of the waveguide assembly.

Figure 1:
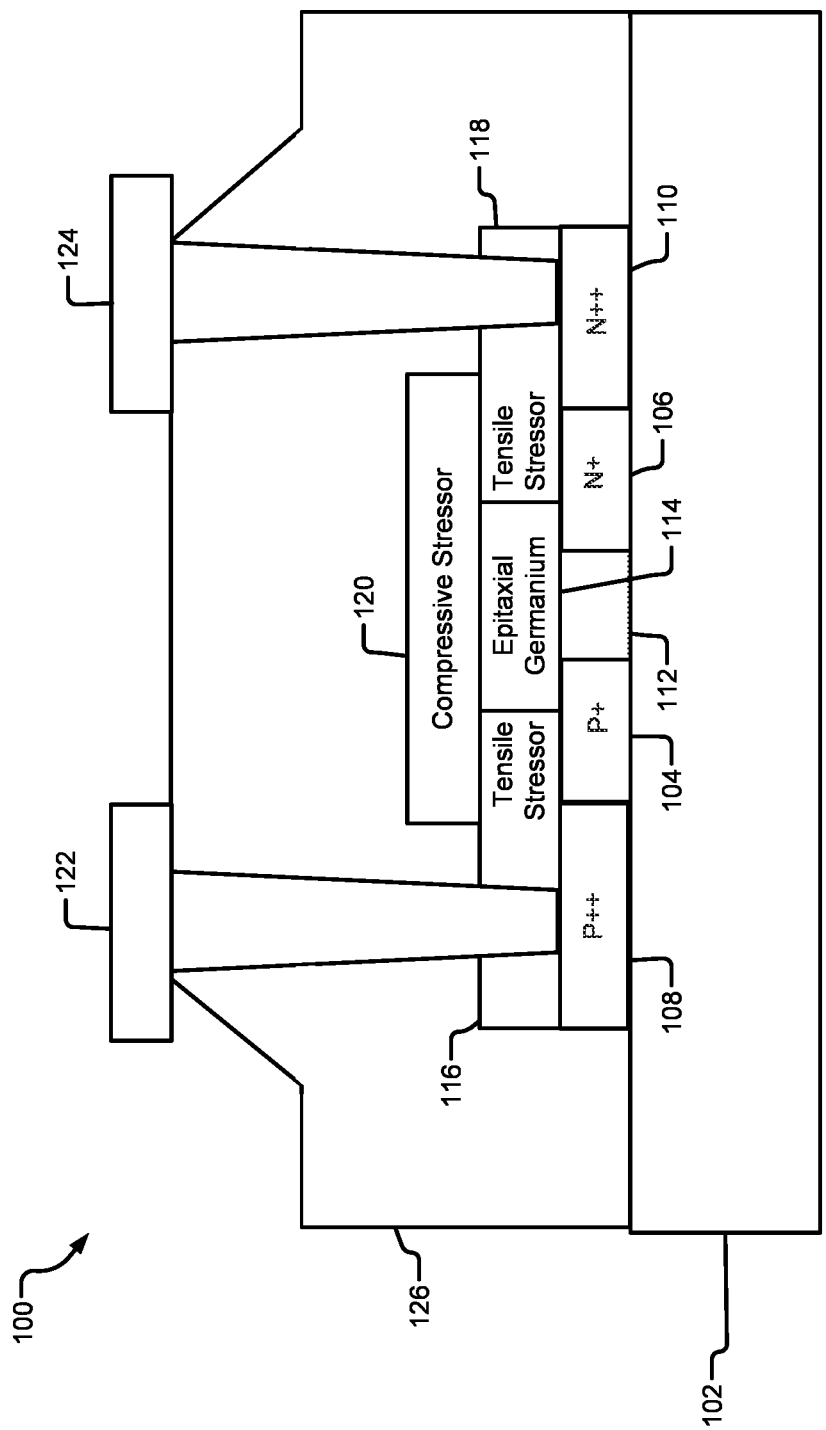
FIG. 1 is a side sectional view of a receiver including a germanium-based photo detector for detecting optical signals in a C-band and an L-band.

FIG. 1 shows a side sectional view of a receiver 100 for receiving optical signals transmitted over a communications network. The receiver 100 includes a germanium-based photo detector for detecting optical signals in a C-band and an L-band. The receiver 100 includes a silicon photonics substrate 102 including multiple regions with respectively different doping. A first region 104 is doped with p-type doping (P+), a second region 106 is doped with n-type doping (N+), a third region 108 is doped with heavier p-type doping (P++) than the first region 104, and a fourth region 110 is doped with heavier n-type doping (N++) than the second region 106. A non-doped region 112 is arranged between the first region 104 and the second region 106. The non-doped region 112 may be an intrinsic region of the silicon photonics substrate 102, which has not been doped.

The receiver 100 includes an epitaxial germanium layer 114 extending at least partially over the first region 104 and the second region 106. The epitaxial germanium layer 114 may include germanium that is deposited via an epitaxy deposition process, including layers of germanium crystal growth (e.g., with one or more defined orientations with respect to a crystalline seed layer). The epitaxial germanium layer 114 extends over the non-doped region 112. The receiver 100 also includes a first tensile stressor component 116 in contact with the epitaxial germanium layer 114, a second tensile stressor component 118 in contact with the epitaxial germanium layer 114, and a compressive stressor component 120 in contact with the epitaxial germanium layer 114.

The first tensile stressor component 116 is in contact with a first lateral side of the epitaxial germanium layer 114, and the second tensile stressor component 118 is in contact with a second lateral side of the epitaxial germanium layer 114. The first lateral side is on an opposite side of the epitaxial germanium layer 114 as the second lateral side. The compressive stressor component 120 is in contact with a top surface of the epitaxial germanium layer 114.

Although FIG. 1 illustrates one compressive stressor component 120 and two tensile stressor components 116 and 118, other example embodiments may include additional or fewer tensile stressor components and compressive stressor components (including zero tensile stressor components or compressive stressor components). In other example embodiments, the compressive stressor component 120 and two tensile stressor components 116 and 118 may be located at other positions with respect to the epitaxial germanium layer 114.

A receive circuit includes a first electrode component 122 in electrical contact with the epitaxial germanium layer 114, and a second electrode component 124 in electrical contact with the epitaxial germanium layer 114. The first electrode component 122 electrically contacts the epitaxial germanium layer 114 through at least one of the first tensile stressor component 116, the first region 104 and the third region 108. The second electrode component 124 electrically contacts the epitaxial germanium layer 114 through at least one of the second tensile stressor component 118, the second region 106 and the fourth region 110.

The receive circuit is configured to generate an electrical output in response to an optical signal received from a network interface of the communications network by the epitaxial germanium layer 114. For example, an optical communication signal (such as light transmitted via a fiber optic cable) may be detected by the epitaxial germanium layer 114, and a value of signal detection or signal non-detection may be transmitted by the first electrode component 122 and the second electrode component 124 to another portion of a receiving network interface of the communications network (which may include the receiver 100).

The first tensile stressor component 116, the second tensile stressor component 118, and the compressive stressor component 120, are configured to mechanically strain the epitaxial germanium layer 114 to modify an optical signal absorption attribute of the epitaxial germanium layer 114. For example, in some embodiments the first tensile stressor component 116 and the second tensile stressor component 118 are configured to mechanically strain the epitaxial germanium layer 114 with tensile stress. The compressive stressor component 120 is also configured to mechanically strain the epitaxial germanium layer 114 with tensile stress (e.g., due to the location of the compressive stressor component 120 on the top surface of the epitaxial germanium layer 114), to modify a band gap of the epitaxial germanium layer 114 to detect optical signals having a wavelength in a range of at least 1530 nanometers to 1565 nanometers. In this case, the epitaxial germanium layer 114 is responsive to optical signals having wavelengths in the entire C-band. When each of the first tensile stressor component 116, the second tensile stressor component 118, and the compressive stressor component 120 are in contact with the epitaxial germanium layer 114, the compressive stressor component 120 may mechanically strain the epitaxial germanium layer with further tensile stress in addition to the tensile stress due to the first tensile stressor component 116 and the second tensile stressor component 118.

In some example embodiments, the first tensile stressor component 116 and the second tensile stressor component 118 are configured to mechanically strain the epitaxial germanium layer 114 with tensile stress, and the compressive stressor component 120 is configured to further mechanically strain the epitaxial germanium layer 114 with additional tensile stress (e.g., in addition to the tensile stress due to the first tensile stressor component 116 and the second tensile stressor component 118, based on the compressive stressor component 120 being located on a top surface of the epitaxial germanium layer 114), to modify a band gap of the epitaxial germanium layer 114 to detect optical signals having a wavelength in a range of at least at least 1530 nanometers to 1625 nanometers. In this case, the epitaxial germanium layer 114 is responsive to optical signals having wavelengths in the entire C-band and the entire L-band.

In various implementations, the amount of mechanical stress of the epitaxial germanium layer 114 may be tuned based on specifying one or more deposition parameters of the first tensile stressor component 116, the second tensile stressor component 118, and the compressive stressor component 120. For example, a specified gas pressure, a specified gas composition, a specified temperature, etc., may be used to deposit the first tensile stressor component 116, the second tensile stressor component 118, and the compressive stressor component 120 to induce a desired amount of mechanical stress of the epitaxial germanium layer 114 to increase detection of the epitaxial germanium layer 114 for optical signals in desired wavelength ranges.

The epitaxial germanium layer 114 is deposited layer by layer using an epitaxy deposition process, and has a crystalline structure with substantially zero stress after deposition. When one or more of the first tensile stressor component 116, the second tensile stressor component 118, and the compressive stressor component 120 mechanically strain the epitaxial germanium layer 114, electron mobility and an optical absorption coefficient in the epitaxial germanium layer 114 are modified. For example, the optical responsivity may be affected due to a change in a band diagram of the epitaxial germanium layer 114 based on the mechanical strain induced in the epitaxial germanium layer 114 by the first tensile stressor component 116, the second tensile stressor component 118, and the compressive stressor component 120.

The optical absorption and detection range of the epitaxial germanium layer 114 may be modified to any desired range within the C-band and L-band wavelengths, such as the entire C-band and L-band (e.g., wavelengths of at least 1530 nm up to 1625 nm), wavelengths covering the entire C-band at least a portion of the L-band, wavelengths covering up to the entire C-band (e.g., wavelengths of at least 1530 nm up to 1565 nm), wavelengths covering a portion of the C-band, and so on. In some example embodiments, the epitaxial germanium layer 114 may be modified to detect optical signals having wavelengths above or below the example wavelength ranges listed above.

For example, non-stressed epitaxial germanium layers may have optical absorption range that extends only partially into a lower end of the C-band. Using at least one of the first tensile stressor component 116, the second tensile stressor component 118, and the compressive stressor component 120 to mechanically strain the epitaxial germanium layer 114 may increase an optical absorption range of the epitaxial germanium layer 114 to include more of the C-band wavelengths (including an entire C-band wavelength range), at least a portion of the L-band wavelengths, or up to the entire L-band wavelength range.

Increasing the signal detection wavelength range of the epitaxial germanium layer 114 increases the usable frequency spectrum of an optical fiber or other suitable communication medium which transmits communication signals to the receiver 100. Increased spectrum utilization facilitates use of more wavelengths in a communication network, and allows for a higher bandwidth for the optical fiber to transmit more data between devices in the communication network.

Modifying the detection range of the epitaxial germanium layer 114 using at least one of the first tensile stressor component 116, the second tensile stressor component 118, and the compressive stressor component 120 to mechanically strain the epitaxial germanium layer 114 allows for use of germanium-based photo detectors, and matured silicon photo detector fabrication technology. For example, the epitaxial germanium layer 114 may be configured to operate as a high-speed photo diode for detection of optical communication signals that are transmitted over a network interconnection. Mainstream fabrication techniques may be used where the first tensile stressor component 116, the second tensile stressor component 118, and the compressive stressor component 120 are added during a normal silicon photonics substrate fabrication process that does not require specialized equipment or processes that add significant time to the fabrication process.

The first tensile stressor component 116 and the second tensile stressor component 118 may be a tensile stressor film. For example, the first tensile stressor component 116 and the second tensile stressor component 118 may include a silicon nitride tensile stress film. The first tensile stressor component 116 and the second tensile stressor component 118 may be configured to mechanically strain the epitaxial germanium layer 114 with any suitable tensile stress, such as a tensile stress of at least 400 MPa.

The compressive stressor component 120 may include a compressive stressor film in contact with a top surface of the epitaxial germanium layer 114. For example, the compressive stressor film may include a silicon dioxide compressive stress film. The compressive stressor component 120 may be configured to mechanically strain the epitaxial germanium layer 114 with any suitable tensile stress value (e.g., when the compressive stressor component 120 is located on a top surface of the epitaxial germanium layer 114).

The receiver 100 includes a cladding layer 126. The cladding layer 126 at least partially overlays the silicon photonics substrate 102 and the epitaxial germanium layer 114. As shown in FIG. 1, the cladding layer 126 is coextensive with the silicon photonics substrate 102. The cladding layer 126 includes an insulator material. One or more silicon nitride layers (or other suitable compound layers) may be embedded in the cladding layer 126. For example, at least one silicon nitride layer may be embedded in the cladding layer 126 to define at least a portion of a waveguide configured to transmit optical signals received from a network interface of a communications network to the epitaxial germanium layer 114.

In the example embodiment illustrated in FIG. 1, the first electrode component 122 and the second electrode component 124 are in electrical contact with only the first lateral side and the second lateral side of the epitaxial germanium layer 114, without any electrode components positioned vertically above the epitaxial germanium layer 114. The arrangement of the first electrode component 122 and the second electrode component 124 at lateral sides of the epitaxial germanium layer 114 causes current to conduct laterally through the epitaxial germanium layer 114, and not vertically up and out of the epitaxial germanium layer 114.

Conducting lateral current through the epitaxial germanium layer 114 inhibits a dark current that occurs in the epitaxial germanium layer 114 during periods where the epitaxial germanium layer 114 does not detect an optical communication signal. For example, lateral current conduction generates a smaller electric field in the epitaxial germanium layer 114, compared to vertical field that punches through the entire epitaxial germanium layer 114 to create a larger current. A lower dark current contributes lower noise, and therefore a better signal-to-noise (SNR) ratio for the receiver 100.

Figure 2:
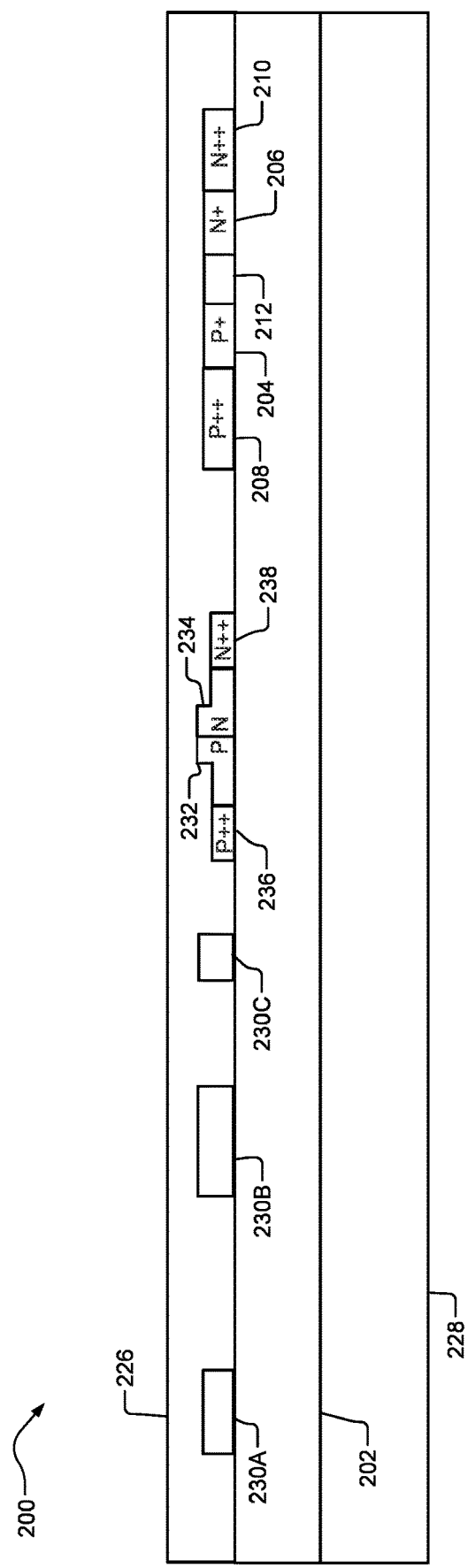
FIG. 2 is a side sectional view of a receiver during an example fabrication process, illustrating doping of a silicon photonics substrate and deposition of a cladding oxide layer.

FIG. 2 shows a side sectional view of a receiver 200 during an example silicon photonics substrate fabrication process, illustrating doping of a silicon photonics substrate 202 and deposition of a cladding oxide layer 226. In some example embodiments, the silicon photonics substrate 202 may include a silicon-on-insulator (501) wafer, having an approximately 220 nm silicon layer on top of a 3 μm insulator layer. The silicon photonics substrate 202 may be on top of a wafer backing layer 228.

One or more silicon waveguides may be defined by lithography and etching. For example, rib etches may be performed such as 60 nm bottom anti-reflective coating (BARC) etch, a 35 nm hard mask etch, and a partial silicon etch of 130 nm, to define multiple silicon regions 230A, 230B and 230C. Other suitable etching depths, or etching processes, may be used in other example embodiments. For example, a slab etch of 90 nm may reduce portions of silicon to the surface of the silicon photonics substrate 202. A photoresist may be used during etching to control depths of etching at various regions.

In some example embodiments, a hard mask strip of sacrificial oxide may be deposited for implantation, such as using a plasma-enhanced chemical vapor deposition (PECVD) to deposit a 10 nm layer of silicon oxide. Different regions may be selectively doped to have different doping characteristics. For example, boron may be used as an implant for fabricating P+ and P++ doped regions such as a first region 204, a third region 208, a fifth region 232 and a seventh region 236. Phosphorous may be used as an implant for fabricating N+ and N++ doped regions such as a second region 206, a fourth region 210, a sixth region 234, and an eighth region 238. The receiver 200 may also include one or more non-doped regions, such as the region 212.

In association with the doping, one or more lithography processes may be used, one or more wafer cleaning processes may be used, one or more photoresist trips may be used, etc. Any suitable dopant activation may be used, such as rapid thermal annealing (RTA) at a temperature of approximately 1030 degrees Celsius for approximately five seconds. Other suitable dopant activation processes and parameters may be used in other example embodiments. The cladding oxide layer 226 may be fabricated using any suitable process, such as deposition of a 400 nm layer of silicon oxide using PECVD. In some example embodiments, pre-CMP reverse etching may be used, with additional silicon oxide top up deposition, and a chemical mechanical planarization (CMP) process.

FIG. 3 shows a side sectional view of the receiver 200, illustrating clearing of a window in the cladding oxide layer 226. For example, an etching process may be used to open a window 240 in the cladding oxide layer 226. FIG. 4 shows a side sectional view of the receiver 200, illustrating epitaxial deposition of germanium in the window 240. For example, selective epitaxy may be performed to deposit layers of germanium to form an epitaxial germanium layer 214. The epitaxial germanium layer 214 may have any suitable deposition thickness, such as at least 300 nm.

Figure 5:
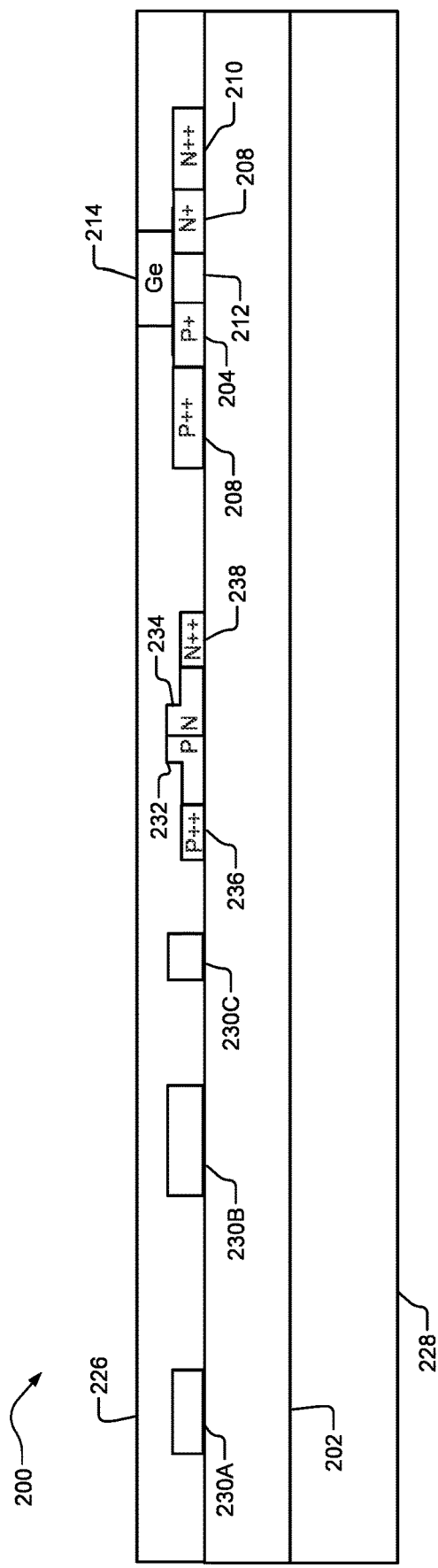
FIG. 5 is a side sectional view of a receiver during an example fabrication process, illustrating chemical mechanical planarization to remove a top portion of the epitaxial germanium of FIG. 4.

FIG. 5 is a side sectional view of the receiver 200 during the example fabrication process, illustrating chemical mechanical planarization (CMP) to remove a top portion of the epitaxial germanium layer 214. For example, a CMP process may be performed to remove a mushroom top of the epitaxial germanium layer 214. After removing the top portion, the epitaxial germanium layer 214 may have any suitable thickness, such as about 250 nm. The top surface of the epitaxial germanium layer 214 may be substantially coplanar with a top surface of the cladding oxide layer 226.

Figure 6:
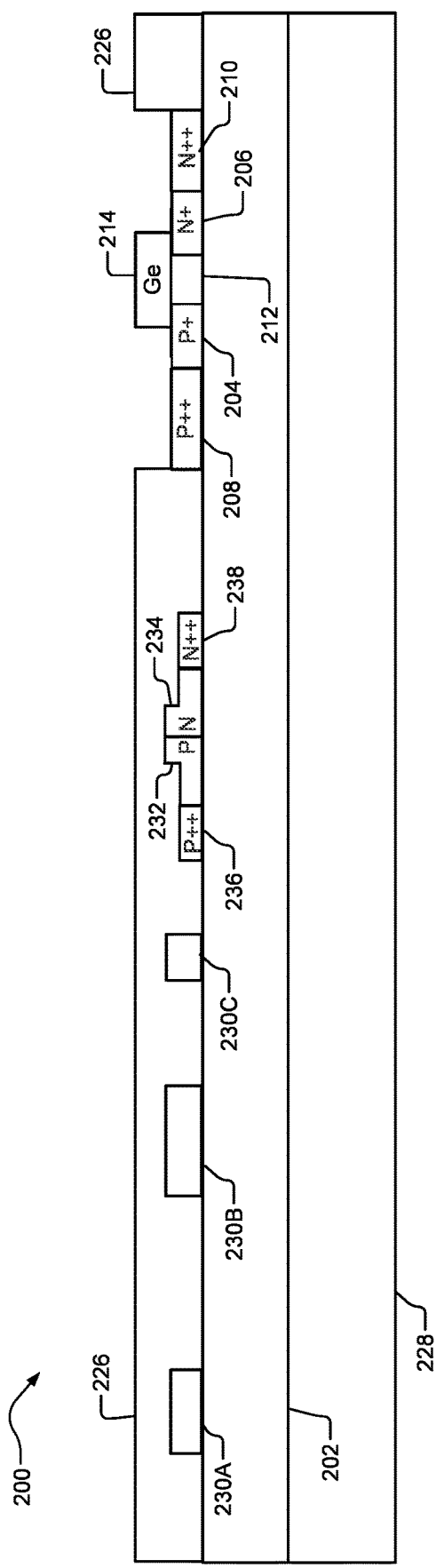
FIG. 6 is a side sectional view of a receiver during an example fabrication process, illustrating clearing of two windows on lateral sides of the epitaxial germanium of FIG. 5.

FIG. 6 is a side sectional view of the receiver 200 illustrating clearing of two windows on lateral sides of the epitaxial germanium layer 214. For example, etching may be used to remove silicon oxide from the cladding oxide layer 226 at around a mesa of the epitaxial germanium layer 214.

Figure 7:
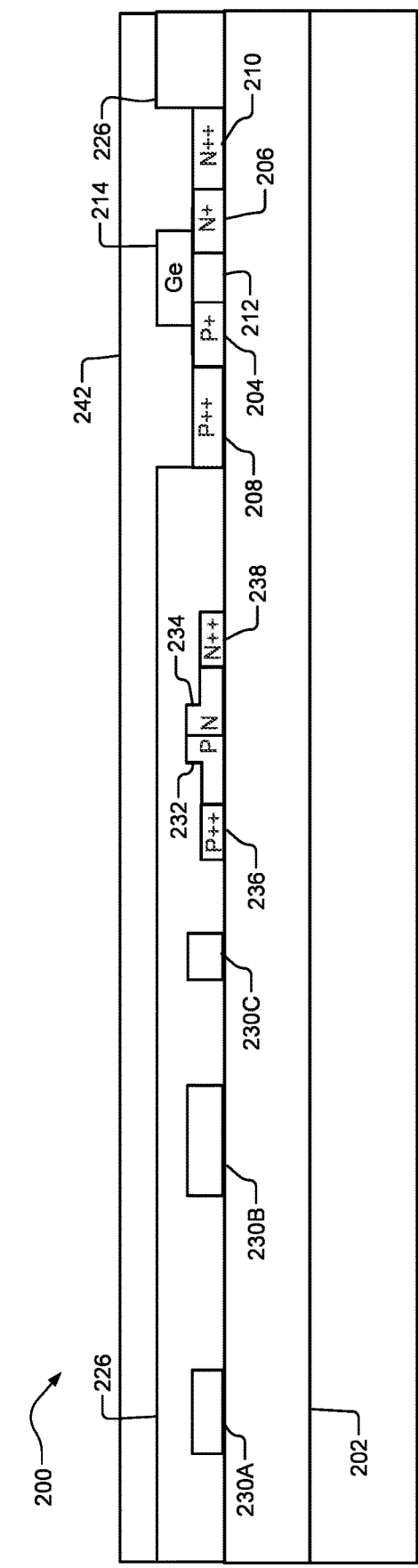
FIG. 7 is a side sectional view of a receiver during an example fabrication process, illustrating deposition of a lateral stressor film in the two windows of FIG. 6.

FIG. 7 is a side sectional view of the receiver 200 illustrating deposition of a tensile stressor film 242 in the two windows created around the epitaxial germanium layer 214. For example, the tensile stressor film 242 may include a silicon nitride film which is deposited via PECVD. The film tensile stress value may be tuned to a desired stress valve by selecting appropriate deposition parameters, such as gas pressure, gas composition, temperature, etc. In some example embodiments, the tensile stressor film 242 may have a tensile stress value of at least 400 MPa or greater.

Figure 8:
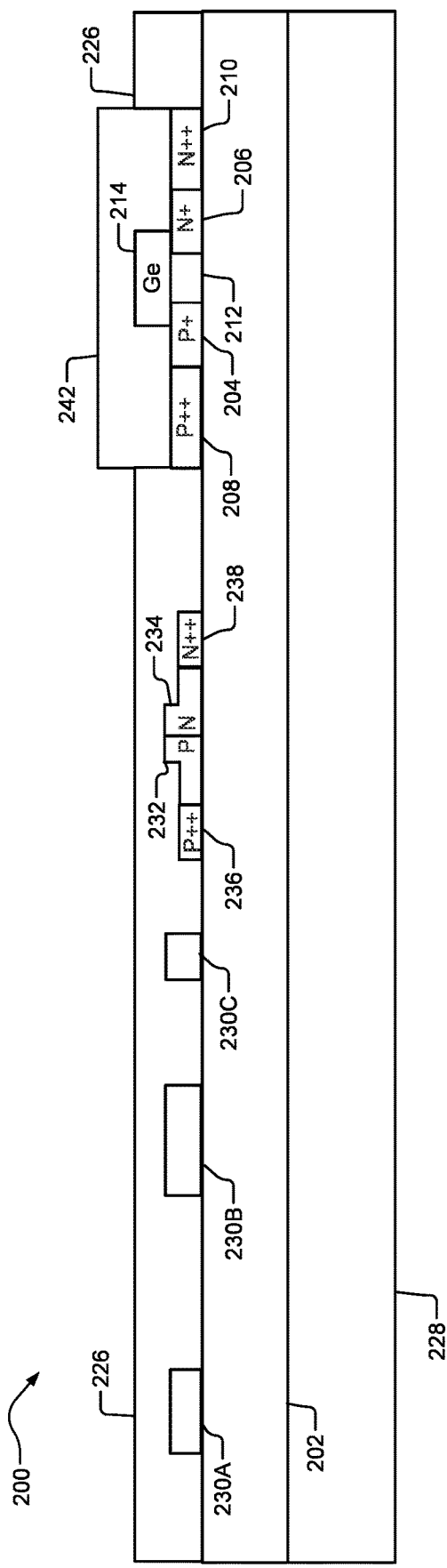
FIG. 8 is a side sectional view of a receiver during an example fabrication process, illustrating removal of excessive portions of the lateral stressor film of FIG. 7.
Figure 9:
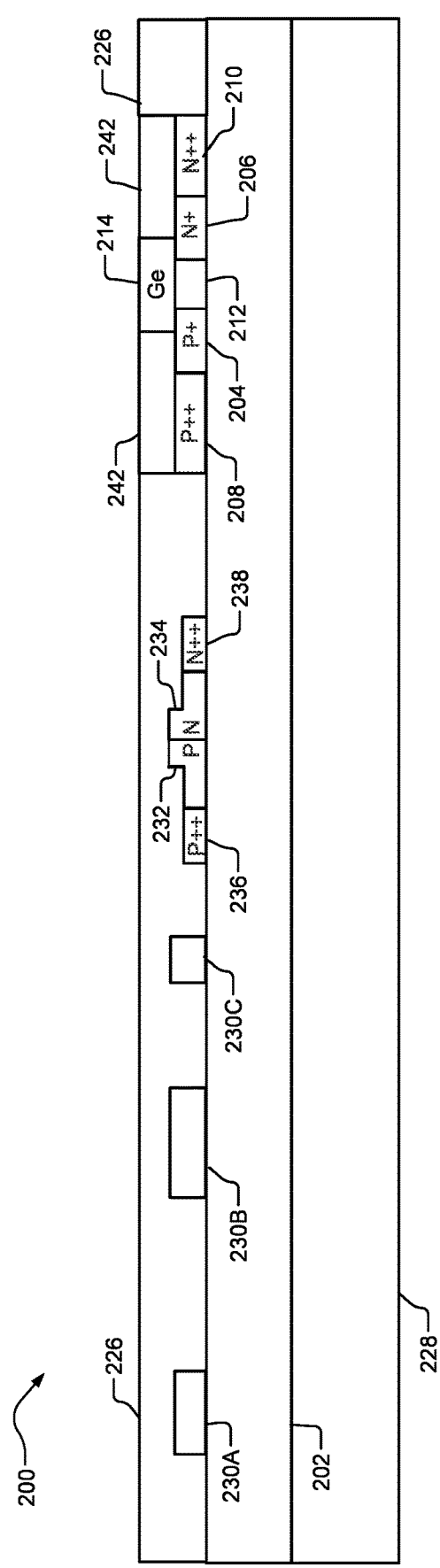
FIG. 9 is a side sectional view of a receiver during an example fabrication process, illustrating chemical mechanical planarization to expose a top surface of the epitaxial germanium layer of FIG. 8.

FIG. 8 is a side sectional view of the receiver 200 illustrating removal of excessive portions of the tensile stressor film 242. For example, etching may be performed to leave only portions of the tensile stressor film 242 located around the epitaxial germanium layer 214. FIG. 9 is a side sectional view of the receiver 200 illustrating chemical mechanical planarization to expose a top surface of the epitaxial germanium layer 214.

FIG. 10 is a side sectional view of the receiver 200 during the example fabrication process, illustrating deposition of a compressive stressor film 244 over the top surface of the epitaxial germanium layer 214. For example, the compressive stressor film 244 may include a silicon oxide film that is deposited using PECVD with a high density plasma (HDP). FIG. 11 is a side sectional view of the receiver 200 illustrating etching the excessive portions of the compressive stressor film 244. As shown in FIG. 11, the compressive stressor film 244 is etched to cover only the top surface of the epitaxial germanium layer 214, and portions of the tensile stressor film 242 on each side of the epitaxial germanium layer 214.

Figure 12:
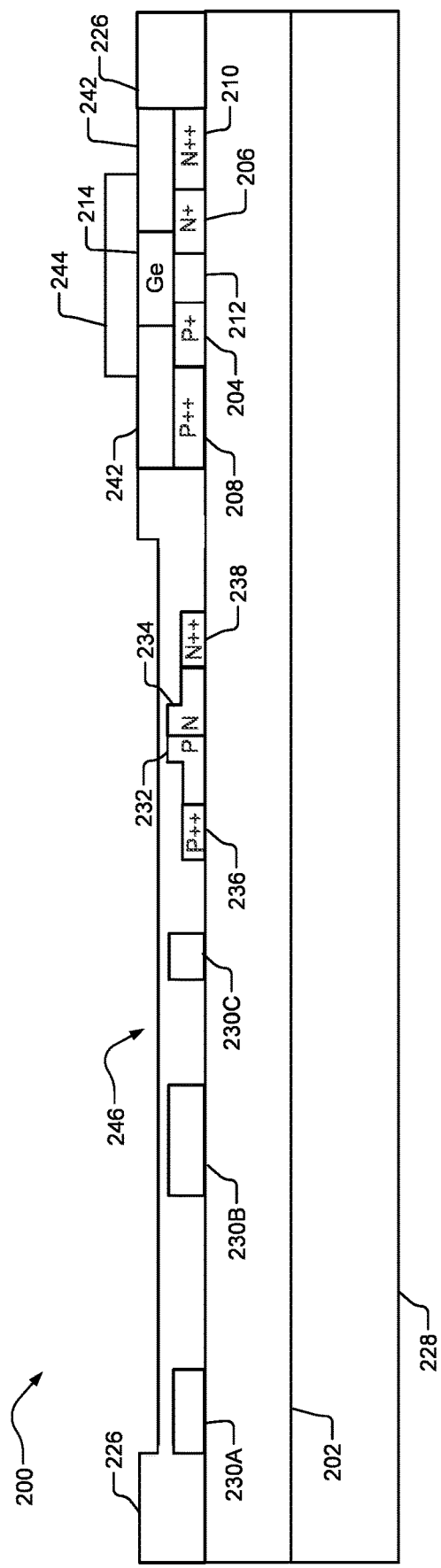
FIG. 12 is a side sectional view of a receiver during an example fabrication process, illustrating etching a waveguide window.

FIG. 12 is a side sectional view of the receiver 200 during the example fabrication process, illustrating etching a waveguide window 246. The waveguide window 246 may be etched to any desired depth, such as leaving approximately 120 nm of silicon oxide on top of a silicon waveguide.

Figure 13:
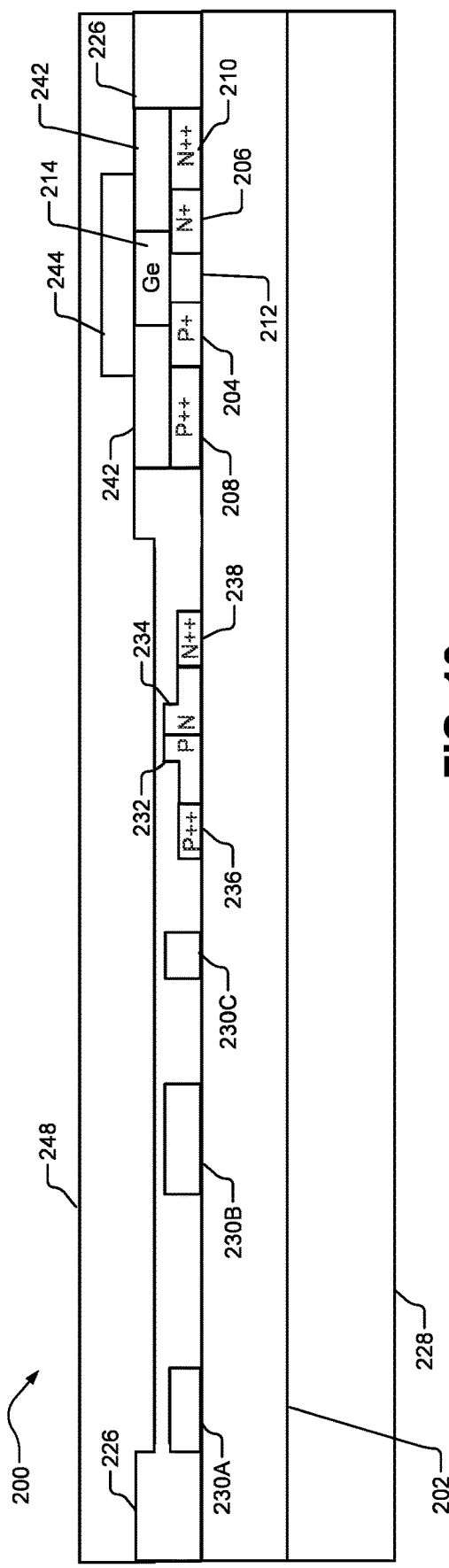
FIG. 13 is a side sectional view of a receiver during an example fabrication process, illustrating deposition of a silicon nitride layer.
Figure 14:
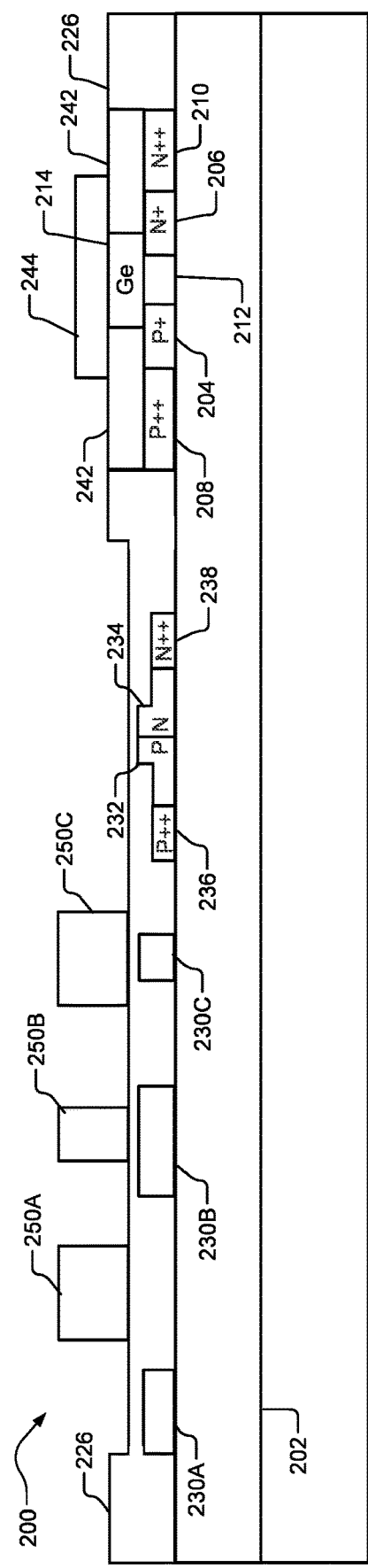
FIG. 14 a side sectional view of a receiver during an example fabrication process, illustrating fabricating a waveguide from the silicon nitride layer of FIG. 13.

FIG. 13 is a side sectional view of the receiver 200, illustrating deposition of a silicon nitride layer 248. For example, approximately 400 nm of silicon nitride may be deposited on top of the cladding oxide layer 226. FIG. 14 a side sectional view of the receiver 200, illustrating fabricating a waveguide from the silicon nitride layer 248. The silicon nitride layer 248 may be patterned and etched to form multiple waveguide regions, such as the waveguide regions 250A, 250B and 250C.

Figure 15:
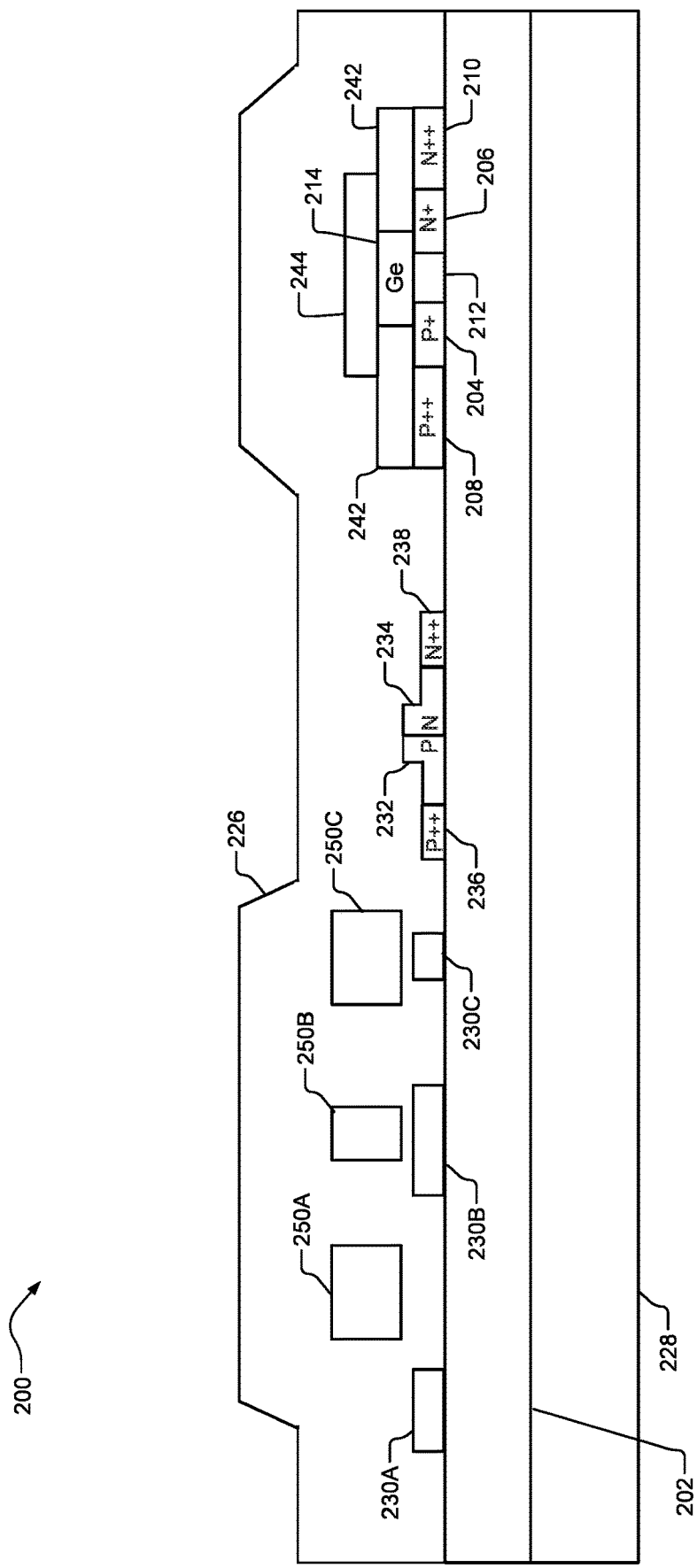
FIG. 15 is a side sectional view of a receiver during an example fabrication process, illustrating deposition of a cladding oxide layer.

FIG. 15 is a side sectional view of the receiver 200 during the example fabrication process, illustrating deposition of additional portions of the cladding oxide layer 226. As shown in FIG. 15, the additional portions of the cladding oxide layer 226 are deposited over the top of the waveguide regions 250A, 250B and 250C, and over the compressive stressor film 244 and the tensile stressor film 242.

Figure 16:
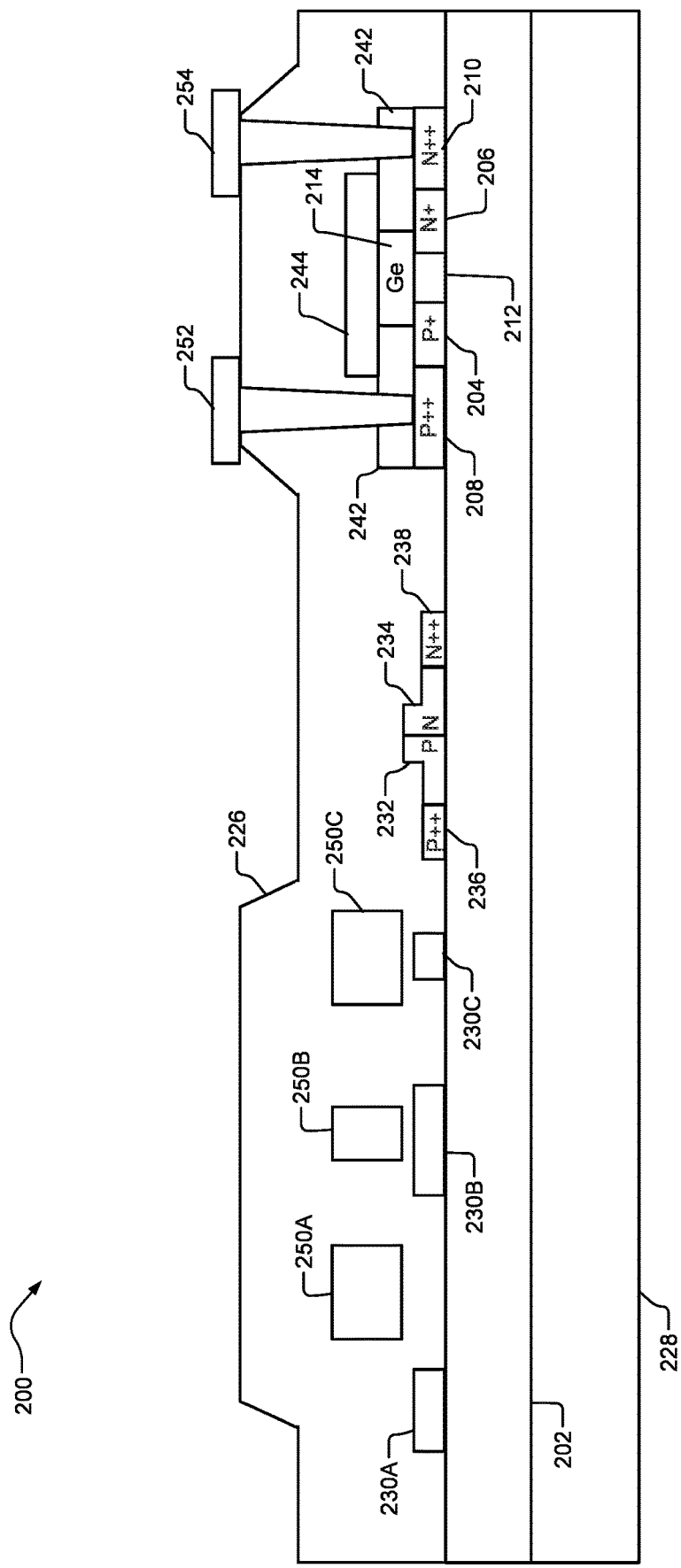
FIG. 16 is a side sectional view of a receiver during an example fabrication process, illustrating fabricating two electrode components.

FIG. 16 is a side sectional view of the receiver 200 during the example fabrication process, illustrating fabricating two electrode components. A first electrode component 252 is fabricated to extend through the cladding oxide layer 226 and contact at least the tensile stressor film 242 on a first side of the epitaxial germanium layer 214, and the second electrode component 254 is fabricated to extend through the cladding oxide layer 226 and contact at least the tensile stressor film 242 on a second lateral side of the epitaxial germanium layer 214.

Figure 17:
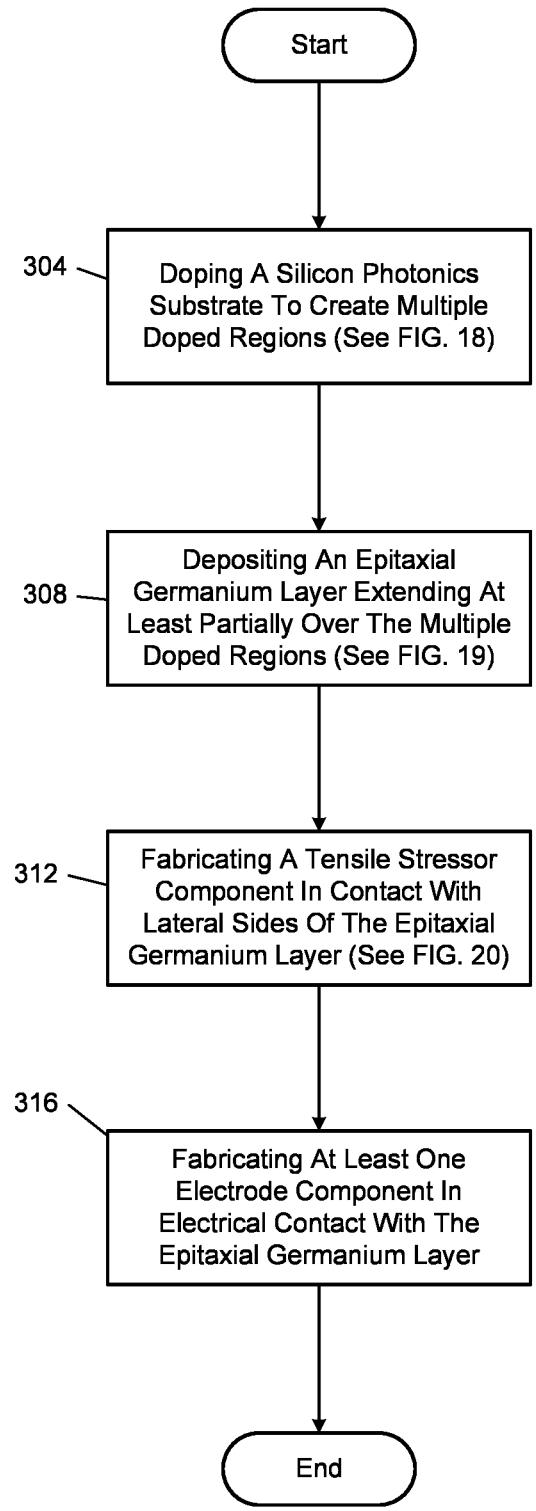
FIG. 17 is a flowchart illustrating an example process for fabricating a germanium-based photo detector for detecting optical signals in a C-band and an L-band.

FIG. 17 is a flowchart illustrating an example process for fabricating a germanium-based photo detector for detecting optical signals in a C-band and an L-band. At 304, the process begins by doping a silicon substrate to create multiple doped regions, which may have respectively different doping (such as P+ doped region(s), P++ doped region(s), N+ doped region(s) and N++ doped region(s)). An example process for doping the silicon photonics substrate is described further below with reference to FIG. 18. At 308, the process includes depositing an epitaxial germanium layer extending at least partially over the multiple doped regions. An example process for depositing an epitaxial germanium layer is described further below with reference to FIG. 19.

At 312, the process includes fabricating a tensile stressor component in contact with a lateral side of the epitaxial germanium layer. The tensile stressor component is configured to mechanically strain the epitaxial germanium layer to modify an optical signal absorption attribute of the epitaxial germanium layer. An example process for fabricating the tensile stressor component is discussed further below with reference to FIG. 20. At 316, the process includes fabricating at least one electrode component in electrical contact with the epitaxial germanium layer.

Figure 18:
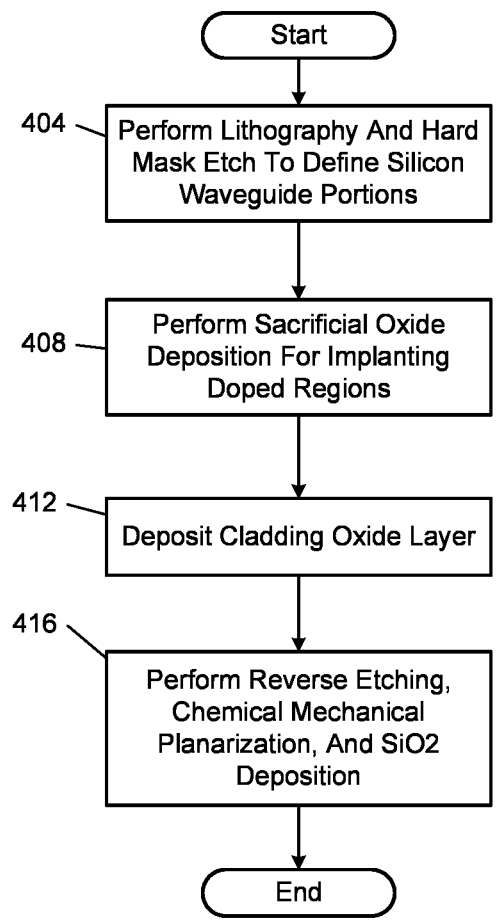
FIG. 18 is a flowchart illustrating an example process for doping a silicon photonics substrate.

FIG. 18 is a flowchart illustrating an example process for doping a silicon photonics substrate. At 404, the process includes performing lithography and hard mask etching to define silicon waveguide portions. At 408, the process includes performing sacrificial oxide deposition for implanting doped regions.

At 412, the process includes depositing a cladding oxide layer. At 416, the process includes performing reverse etching, chemical mechanical planarization, and silicon oxide deposition, to create a layer of silicon oxide having a substantially uniform top surface.

Figure 19:
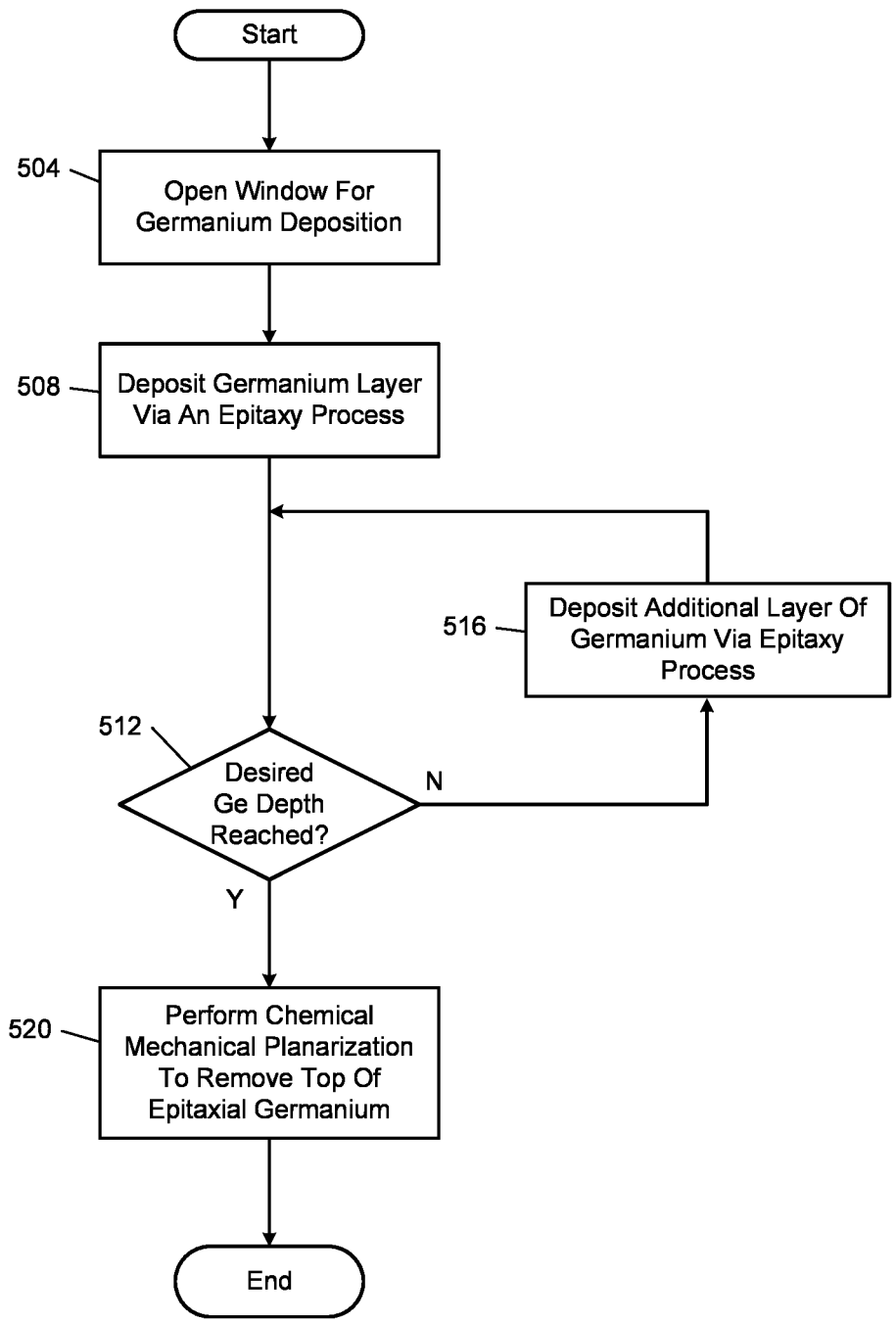
FIG. 19 is a flowchart illustrating an example process for depositing a germanium epitaxial layer.

FIG. 19 is a flowchart illustrating an example process for depositing a germanium epitaxial layer. At 504, the process includes opening a window for germanium deposition. For etching may be performed in a silicon oxide layer to open a window of a desired size to deposit the germanium via an epitaxy process.

At 508, the process includes depositing a layer of germanium via an epitaxy process. At 508, the process determines whether a desired depth or thickness of germanium has been deposited. For example, if a desired thickness of germanium is 300 nm, the process will determine whether the height of the deposited germanium so far in the process has reached 300 nm.

If the process determines at 512 that the desired depth of germanium has not been reached, the process proceeds to 516 to deposit an additional layer of germanium via the epitaxy process. In this manner, epitaxial deposition of germanium is performed layer by layer until a desired germanium height is reached.

Once the desired germanium height is reached at 512, the process proceeds to 520 to perform chemical mechanical planarization on the epitaxial germanium layer. The chemical mechanical planarization process removes a mushroom top at the top portion of the epitaxial germanium layer.

Figure 20:
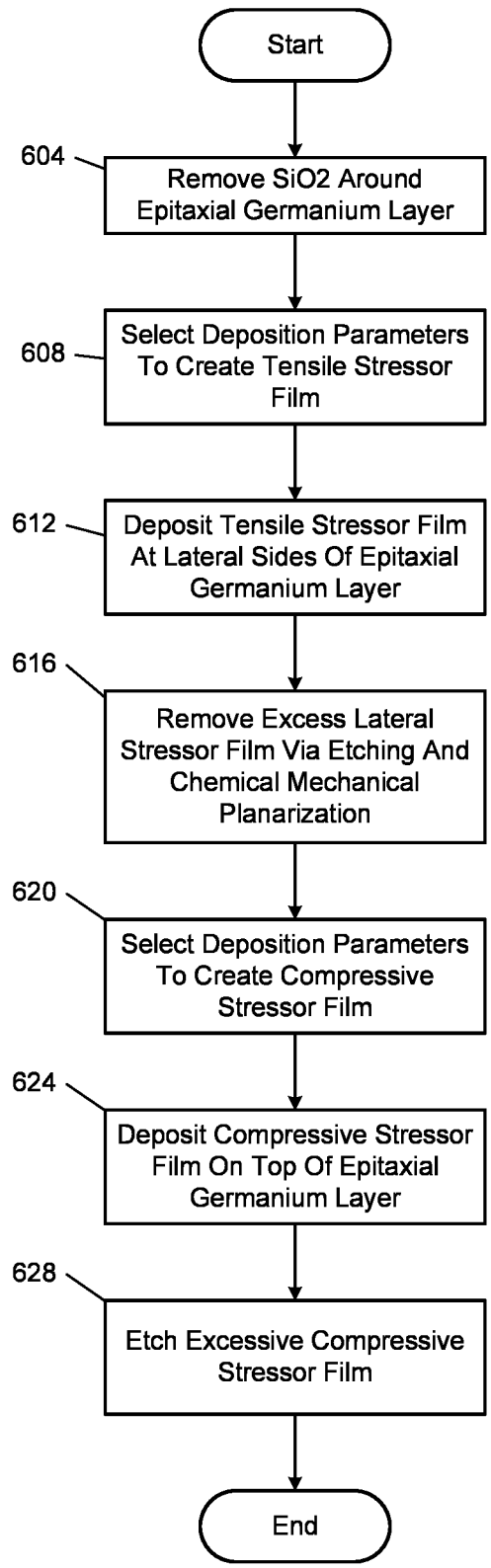
FIG. 20 is a flowchart illustrating an example process for fabricating a tensile stressor component in contact with an epitaxial germanium layer.

FIG. 20 is a flowchart illustrating an example process for fabricating a tensile stressor component in contact with an epitaxial germanium layer. At 604, the process includes removing silicon oxide around an epitaxial germanium layer. For example, a silicon oxide layer may be etched at lateral sides of the epitaxial germanium layer.

At 608, the process selects deposition parameters to create the tensile stressor film. For example, deposition parameters such as gas pressure, gas composition, temperature, etc. may be adjusted to specify a desired tensile stress value of the tensile stressor film. At 612, the process includes depositing a tensile stressor film at lateral sides of the epitaxial germanium layer.

At 616, the process includes removing excess lateral stressor film via etching, and performing chemical mechanical planarization. For example, the lateral stressor film may be etched away except for areas adjacent to the epitaxial germanium layer, and a chemical mechanical planarization process may be performed to expose a top surface of the epitaxial germanium layer.

At 620, the process includes selecting deposition parameters for creating a compressive stressor film. For example, deposition parameters such as gas pressure, gas composition, temperature, etc. may be adjusted to specify a desired compressive stress value of the compressive stressor film. At 624, the process includes depositing a compressive stressor film over a top surface of the epitaxial germanium layer. At 628, the process includes etching the excessive compressive stressor film, such that only a portion of the compressive stressor film remains to cover the top surface of the epitaxial germanium layer, and optionally at least portions of top surfaces of the tensile stressor films at lateral sides of the epitaxial germanium layer.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

When a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C." In this application, apparatus elements described as having particular attributes or performing particular operations are specifically configured to have those particular attributes and perform those particular operations. Although the terms first, second, third, etc. may be used herein to describe various elements, components, and/or regions, these elements, components, and/or regions should not be limited by these terms, unless otherwise indicated.

What is claimed is:

1. A receiver for receiving optical signals transmitted over a communications network, the receiver comprising:
    a silicon photonics substrate including multiple regions with respectively different doping;
    an epitaxial germanium layer extending at least partially over at least two or more of regions with different doping;
    at least one of a tensile stressor component and a compressive stressor component in contact with the epitaxial germanium layer, the tensile stressor component and the compressive stressor component respectively configured to mechanically strain the epitaxial germanium layer to modify an optical signal absorption attribute of the epitaxial germanium layer; and
    a receive circuit including at least one electrode component in electrical contact with the epitaxial germanium layer, the receive circuit configured to generate an electrical output in response to an optical signal received from a network interface of the communications network by the epitaxial germanium layer.

2. The receiver of claim 1, wherein the tensile stressor component comprises a tensile stressor film in contact with a lateral side of the epitaxial germanium layer.

3. The receiver of claim 2, wherein:
    the tensile stressor film is a first tensile stressor film;
    the lateral side of the epitaxial germanium layer is a first lateral side; and the receiver includes a second tensile stressor film in contact with a second lateral side of the epitaxial germanium layer, the second lateral side on an opposite side of the epitaxial germanium layer as the first lateral side.

4. The receiver of claim 3, wherein each of the first tensile stressor film and the second tensile stressor film include a silicon nitride tensile stress film.

5. The receiver of claim 4, wherein the silicon nitride tensile stress film is configured to mechanically strain the epitaxial germanium layer with a tensile stress of at least 400 MPa.

6. The receiver of claim 1, wherein the compressive stressor component comprises a compressive stressor film in contact with a top surface of the epitaxial germanium layer.

7. The receiver of claim 6, wherein the compressive stressor film includes a silicon dioxide compressive stress film.

8. The receiver of claim 1, wherein the at least one of the tensile stressor component and the compressive stressor component is configured to mechanically strain the epitaxial germanium layer with tensile stress to modify a band gap of the epitaxial germanium layer to detect optical signals having a wavelength in a range of at least 1530 nanometers to 1565 nanometers.

9. The receiver of claim 8, wherein the at least one of the tensile stressor component and the compressive stressor component is configured to mechanically strain the epitaxial germanium layer with tensile stress to modify the band gap of the epitaxial germanium layer to detect optical signals having a wavelength in a range of at least 1530 nanometers to 1625 nanometers.

10. The receiver of claim 1, further comprising a cladding layer at least partially overlaying the silicon photonics substrate and the epitaxial germanium layer, wherein the cladding layer includes an insulator material.

11. The receiver of claim 10, wherein the cladding layer is coextensive with the silicon photonics substrate.

12. The receiver of claim 10, further comprising at least one silicon nitride layer embedded in the cladding layer, the at least one silicon nitride layer defining at least a portion of a waveguide configured to transmit optical signals received from the network interface of the communications network to the epitaxial germanium layer.

13. The receiver of claim 1, wherein:
the at least one electrode component is a first electrode component in electrical contact with a first lateral side of the epitaxial germanium layer; and
the receiver includes a second electrode component in electrical contact with a second lateral side of the epitaxial germanium layer, the second lateral side on an opposite side of the epitaxial germanium layer as the first lateral side.

14. The receiver of claim 13, wherein the first electrode component and the second electrode component are in electrical contact with only the first lateral side and the second lateral side of the epitaxial germanium layer to conduct current laterally through the epitaxial germanium layer to inhibit a dark current during periods where the epitaxial germanium layer does not detect an optical communication signal.

15. The receiver of claim 1, wherein the epitaxial germanium layer is configured to operate as a high-speed photo diode for detection of optical communication signals that are transmitted over a network interconnection.

16. The receiver of claim 1, wherein the at least one of the tensile stressor component and the compressive stressor component is configured to mechanically strain the epitaxial germanium layer to modify a bandgap property of the of the epitaxial germanium layer to modify an optical signal absorption range of the epitaxial germanium layer.

* * * * *